United States Patent [19]
Walker et al.

[11] Patent Number: 5,659,883
[45] Date of Patent: Aug. 19, 1997

[54] SELECTION BETWEEN SEPARATELY RECEIVED MESSAGES IN DIVERSE-FREQUENCY REMOTE-CONTROL COMMUNICATION SYSTEM

[75] Inventors: Gordon Kent Walker, Escondido; Branislav Petrovic, La Jolla; Ashok K. George, San Diego, all of Calif.

[73] Assignee: General Instrument Corporation, Chicago, Ill.

[21] Appl. No.: 934,766

[22] Filed: Aug. 24, 1992

[51] Int. Cl.⁶ .................................................. H04B 7/04
[52] U.S. Cl. .......................... 455/59; 455/92; 455/103; 455/133; 359/146
[58] Field of Search .................... 455/59, 101, 103, 455/133, 134, 135, 92, 352; 359/145, 146; 371/8.2

[56] References Cited

U.S. PATENT DOCUMENTS

| | | | |
|---|---|---|---|
| 4,904,993 | 2/1990 | Sato | 359/145 |
| 5,034,997 | 7/1991 | Iwasaki | 455/59 |
| 5,187,711 | 2/1993 | Hondohara | 371/8.2 |

FOREIGN PATENT DOCUMENTS

| | | | |
|---|---|---|---|
| 176293 | 8/1987 | Japan | 455/92 |

Primary Examiner—Reinhard J. Eisenzopf
Assistant Examiner—Thanh Le
Attorney, Agent, or Firm—Edward W. Callan

[57] ABSTRACT

In a remote-control communication system, a signal generating unit includes a first signal transmitter for transmitting a first signal at a first frequency, such as UHF, a second signal transmitter for transmitting a second signal at a second frequency, such as an infrared frequency, that is diverse from the first frequency; a keyboard for generating an information signal containing a given message, which is modulated onto both the first signal and the second signal; wherein both the first and second modulated signals are transmitted in response to a key of the keyboard being pressed to generate the information signal. A receiver for the system includes a microcontroller for processing the given message to control a given operation of an electronic communication apparatus; a UHF detector and demodulator unit and an infrared detector and demodulator unit, which respectively detect and demodulate the first and second modulated signals to provide the information signal containing the given message. The microcontroller also processes both the information signal provided by demodulating the first modulated signal and the information signal provided by demodulating the second modulated signal to select the given message for operation-control processing by the microcontroller from either the information signal provided by demodulating the first modulated signal or the information signal provided by demodulating the second modulated signal.

14 Claims, 1 Drawing Sheet

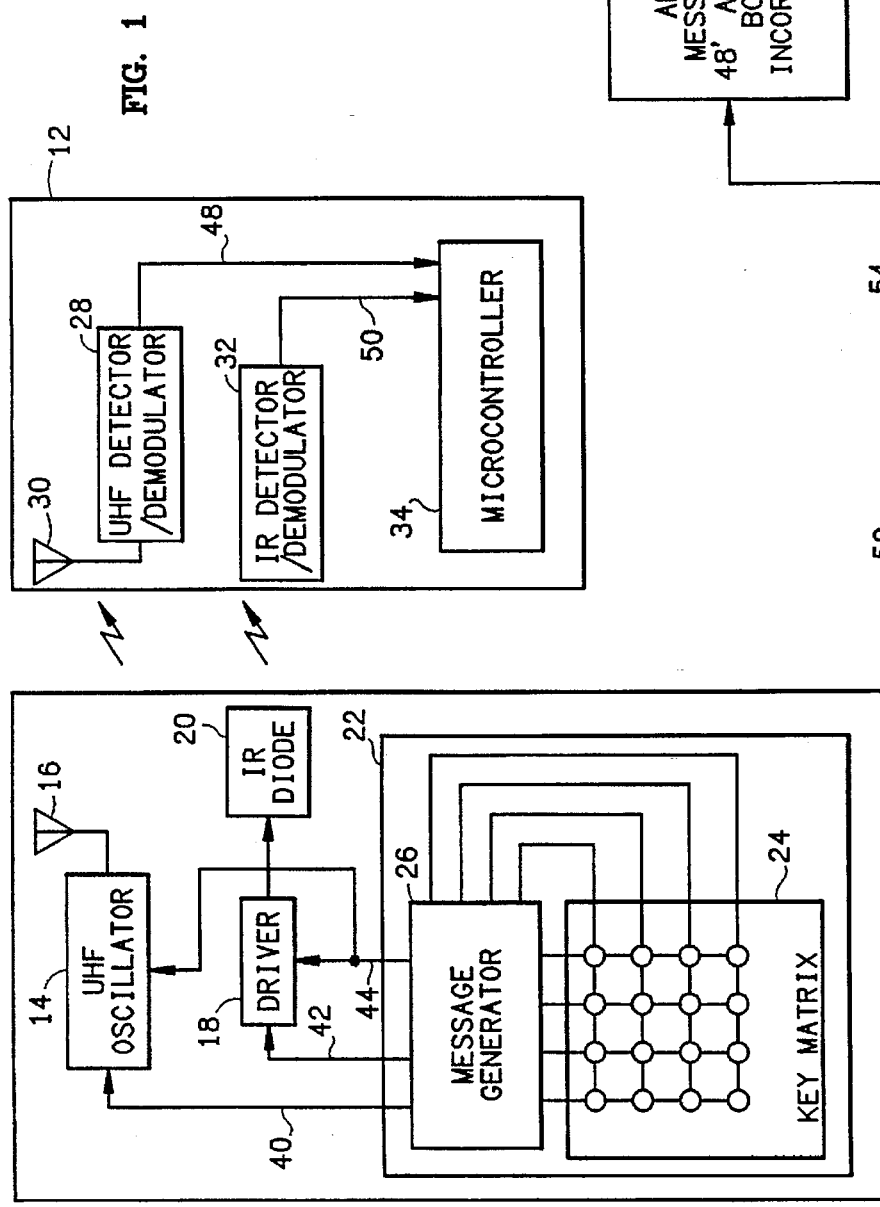

SELECTION BETWEEN SEPARATELY RECEIVED MESSAGES IN DIVERSE-FREQUENCY REMOTE-CONTROL COMMUNICATION SYSTEM

BACKGROUND OF THE INVENTION

The present invention generally pertains to electronic communication system and is particularly directed to diverse-frequency remote-control communications.

Remote control communication systems are widely used for communicating command messages to a television receiver, a video recorder/player, a television descrambler, a compact-disc player and other electronic apparatus.

Information signals transmitted in remote-control communication system are subject to interference from extraneous sources. In some prior art remote-control communication systems, intermittent interference at different frequencies may be avoided by selectively modulating an information signal containing a given message onto a signal for transmission at a frequency that then is believed to be free of interference. A signal generating unit for such a remote control system includes a first signal transmitter for transmitting a first signal at a first frequency, such as an infrared (IR) frequency; a second signal transmitter for transmitting a second signal at a second frequency, such as an ultra-high frequency (UHF) that is diverse from the first frequency; means for generating an information signal containing a given message; means for modulating the first signal with the information signal; means for modulating the second signal with the information signal; and actuating means including a switch for selectively causing either the first signal or the second signal to be modulated with the information signal and transmitted. A receiver for such a remote control system includes control means for processing the given message to control a given operation of an electronic communication apparatus; means for detecting and demodulating either the first modulated signal at the first frequency or the second modulated signal at the second frequency to provide the information signal containing the given message; and a switch for enabling the receiver to detect the transmitted signal at either the first frequency or the second frequency.

SUMMARY OF THE INVENTION

The present invention provides a more versatile and reliable remote-control communication system, comprising a signal generating unit including a first signal transmitter for transmitting a first signal at a first frequency; a second signal transmitter for transmitting a second signal at a second frequency that is diverse from the first frequency; means for generating an information signal containing a given message; means for modulating the first signal with the information signal; means for modulating the second signal with the information signal; and actuating means for causing both the first modulated signal and the second modulated signal to be transmitted; and a receiver including control means for processing the given message to control a given operation of an electronic communication apparatus; means for detecting and demodulating the first modulated signal to provide the information signal containing the given message; means for detecting and demodulating the second modulated signal to provide the information signal containing the given message; and processing means for processing both the information signal provided by demodulating the first modulated signal and the information signal provided by demodulating the second modulated signal to select the given message for said operation-control processing by the control means from either the information signal provided by demodulating the first modulated signal or the information signal provided by demodulating the second modulated signal, wherein the processing means includes means for determining whether the given message contained in the information signal provided by demodulating the first modulated signal and the given message contained in the information signal provided by demodulating the second modulated signal are commonly derived; and means for selecting among the given messages contained in the demodulated information signals for said message processing by the control means in accordance with the determination of whether the given message contained in the information signal provided by demodulating the first modulated signal and the given message contained in the information signal provided by demodulating the second modulated signal are commonly derived.

The system of the present invention consistently provides reliable communication of the information signal at the most interference-free frequency without the user of the system having to determine which frequency is most interference-free and then operate switches to provide communication of the information signal at that frequency.

In a separate aspect, the present invention further separately provides a receiver as recited above.

Additional features of the present invention are described in relation to the description of the preferred embodiment.

BRIEF DESCRIPTION OF THE DRAWING

FIG. 1 is a block diagram of a preferred embodiment of a diverse-frequency remote control system according to the present invention.

FIG. 2 is a diagram of certain processing routines performed by the microcontroller included in the system of FIG. 1.

DESCRIPTION OF THE PREFERRED EMBODIMENT

Referring to FIG. 1, a preferred embodiment of the system of the present invention includes a signal generating unit 10 and a receiver 12. The signal generating unit 10 includes a UHF oscillator 14 and a loop antenna 16 for transmitting a first signal at a UHF frequency, a driver circuit 18 and an infrared diode 20 for transmitting a second signal at an infrared frequency, and a keyboard 22, which includes a key matrix 24 and a message generator 26. The receiver includes a UHF detector and demodulator unit 28 coupled to an antenna 30, an infrared detector and demodulator unit 32 and a microcontroller 34.

The UHF oscillator 14 and the loop antenna 16 are adapted for transmitting a first signal at a UHF frequency. The driver circuit 18 and the infrared diode 20 are adapted for transmitting a second signal at an infrared frequency.

The key matrix 24 is coupled to the message generator 26 for causing an information signal containing a given message to be generated in response to pressing a given key of the matrix 24. The information signal is forward-error-correction coded in accordance with CRC coding to improve the error performance of its transmission. The information signal is provided on both line 40 to the UHF oscillator 14 and line 42 to the driver circuit 18.

Pressing a key of the key matrix 24 to generate the information signal also causes the message generator 26 to provide an actuation signal on line 44 to actuate both the UHF oscillator 14 and the driver circuit 18, whereupon the UHF oscillator 14 modulates the first signal with the information signal on line 40 and the driver circuit 18 modulates the second signal with the information signal on line 42 and both the first modulated signal and the second modulated signal are transmitted.

The modulation format of the transmission is optimized to best match the transmission media. The UHF oscillator 14 applies pulse-position modulated AM and the driver circuit 18 applies tone-position modulated AM, with the information signal being carried on a 30 to 80 kHz subcarrier. This avoids much of the background infrared interference which is greater at lower frequencies.

In the receiver 12, the UHF detector and demodulator unit 28 detects and demodulates the first modulated signal to provide the information signal containing the given message on line 48; and the infrared detector and demodulator unit 32 detects and demodulates the second modulated signal to provide the information signal containing the given message on line 50. The infrared detector and demodulator unit 32 also demodulates the subcarrier so that the baseband format of the demodulated information signals on lines 48 and 50 are the same.

The demodulated information signals on lines 48 and 50 are respectively applied to separate event processor arrays, UARTs or some other type of like serial ports to the microcontroller 34. The baseband bandwidths of the UHF demodulator unit 28 and the infrared demodulator unit 32 are band limited internally such that a minimum pulse width at the inputs to the serial ports is assured. Since the transition rate of the inputs is limited, the microcontroller 34 can always complete the processing of the information signals received at both ports, whether the modulated first and second signals are transmitted simultaneously or sequentially.

The microcontroller 34 processes both the information signal on line 48 and the information signal on line 50 to select the given message from either the information signal provided on line 48 or the information signal provided on line 50 for operation-control processing by the microcontroller 34. The microcontroller 34 processes the given message selected by the microcontroller 34 to control a given operation of an electronic communication apparatus coupled to the remote-control system receiver 12, as commanded by the given message, such as selecting a given communication channel, or adjusting volume for a television receiver.

Referring to FIG. 2, the microcontroller 34 first performs an error-detection-and-correction routine 52, wherein both the given message 48' in the information signal on line 48 and the given message 50' in the information signal on line 50 are corrected to the greatest extent possible in accordance with their forward-error-correction CRC coding.

The microcontroller 34 next performs a routine 54 of determining whether both of the messages 48' and 50' are correct, as determined by the error-detection-and-correction routine 52.

When the microcontroller 34 determines that not both of the given messages 48' and 50' are correct, as determined by the routine 54, the microcontroller 34 performs a routine 56 of determining whether both of the messages 48' and 50' are incorrect, as determined by the error-detection-and-correction routine 52.

When the microcontroller 34 determines that only one of the given messages 48' and 50' is not correct, as determined by the routine 56, the microcontroller 34 performs a routine 58 of selecting the correct message for said operation-control processing by the microcontroller 34.

When the microcontroller 34 determines that neither of the given messages 48' and 50' is correct, as determined by the routine 56, the microcontroller 34 performs a routine 60 of discarding both messages, whereby neither of the messages 48' and 50' is processed by the microcontroller 34.

The microcontroller 34 also performs a routine 62 of determining whether the given message 48' retrieved from the information signal on line 48 and the given message 50' retrieved from the information signal on line 50 are commonly derived from the same press of a given key of the key matrix 24 by determining whether the information signal on line 48 and the information signal on line 50 are received within a predetermined interval of each other.

In an alternative preferred embodiment, the information signals are time-stamp coded by the message generator 26 in the keyboard 22 so that the microcontroller 34 can determine whether the given messages contained in the respective information signals on lines 48 and 50 are commonly derived from the same press of a given key of the key matrix 24 by comparing the time-stamped codes in the respective information signals on lines 48 and 50.

When the microcontroller 34 determines that the messages 48' and 50' are commonly derived, as determined by routine 62, and that both of the given messages 48' and 50' are correct, as determined by the routine 54 the microcontroller 34 performs a routine 64 of always selecting either the message 48' or the message 50' for said operation-control processing by the microcontroller 34 in accordance with a predetermined priority between either line 48 or line 50.

In one preferred embodiment, when the microcontroller 34 determines that the given messages 48' and 50' are not commonly derived, as determined by routine 62, and that both of the given messages 48' and 50' are correct, as determined by the routine 54 the microcontroller 34 performs the routine 64 of always selecting either the message 48' or the message 50' for said operation-control processing by the microcontroller 34 in accordance with a predetermined priority between either line 48 or line 50.

In an alternative preferred embodiment, as illustrated by dashed lines, when the microcontroller 34 determines that the given messages 48' and 50' are not commonly derived, as determined by routine 62, and that both of the given messages 48' and 50' are correct, as determined by the routine 54 the microcontroller 34 performs the routine 60 of discarding both messages, whereby neither of the messages 48' and 50' is processed by the microcontroller 34.

We claim:

1. A remote-control communication system, comprising
 a signal generating unit, including
 a first signal transmitter for transmitting a first signal at a first frequency;
 a second signal transmitter for transmitting a second signal at a second frequency that is diverse from the first frequency;
 means for generating an information signal containing a given message;
 means for modulating the first signal with the information signal;
 means for modulating the second signal with the information signal; and
 actuating means for causing both the first modulated signal and the second modulated signal to be transmitted; and
 a receiver, comprising
 control means for processing the given message to control a given operation of an electronic communication apparatus;

means for detecting and demodulating the first modulated signal to provide the information signal containing the given message;

means for detecting and demodulating the second modulated signal to provide the information signal containing the given message; and processing means for processing both the information signal provided by demodulating the first modulated signal and the information signal provided by demodulating the second modulated signal to select the given message for said operation-control processing by the control means from either the information signal provided by demodulating the first modulated signal or the information signal provided by demodulating the second modulated signal, wherein the processing means includes means for determining whether the given message contained in the information signal provided by demodulating the first modulated signal and the given message contained in the information signal provided by demodulating the second modulated signal are commonly derived; and means for selecting among the given messages contained in the demodulated information signals for said message processing by the control means in accordance with the determination of whether the given message contained in the information signal provided by demodulating the first modulated signal and the given message contained in the information signal provided by demodulating the second modulated signal are commonly derived.

2. A system according to claim 1, wherein the processing means includes means for detecting and correcting errors in the given messages contained in the demodulated information signals; and means for selecting among the given messages contained in the demodulated information signals for said message processing by the control means in accordance with said error detection and correction.

3. A system according to claim 1, wherein the signal generating means further comprise means for forward-error-correction coding the given message; and wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal and the error-corrected given message from the second modulated signal are both correct; and wherein the processing means is adapted for selecting for said message processing by the control means either the given message from the first modulated signal or the given message from the second modulated signal in accordance with a predetermined priority between said messages when the processing means determine that both messages are correct and that both messages are commonly derived.

4. A system according to claim 1, wherein the signal generating means further comprise means for forward-error-correction coding the given message; and wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal and the error-corrected given message from the second modulated signal are both correct; and wherein the processing means is adapted for selecting for said message processing by the control means either the given message from the first modulated signal or the given message from the second modulated signal in accordance with a predetermined priority between said messages when the processing means determine that both messages are correct and that both messages are not commonly derived.

5. A system according to claim 1, wherein the signal generating means further comprise means for forward-error-correction coding the given message; and wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal and the error-corrected given message from the second modulated signal are both correct; and wherein the processing means is adapted for discarding both the message from the first modulated signal and the given message from the second modulated signal when the processing means determine that both messages are correct and that both messages are not commonly derived, whereby neither message is processed by the control means.

6. A system according to claim 1, wherein the signal generating means further comprise means for forward-error-correction coding the given message; and wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal is correct and whether the error-corrected given message from the second modulated signal is correct; and wherein the processing means is adapted for selecting for said message processing by the control means either the given message from the first modulated signal or the given message from the second modulated signal in accordance with which is correct when the processing means determine that only one of said messages is correct without regard as to whether or not both messages are commonly derived.

7. A system according to claim 1, wherein the signal generating means further comprise means for forward-error-correction coding the given message; and wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal is correct and whether the error-corrected given message from the second modulated signal is correct; and wherein the processing means is adapted for discarding the given message from the first modulated signal and the given message from the second modulated signal when the processing means determine that both of said messages are incorrect without regard as to whether or not both messages are commonly derived, whereby neither message is processed by the control means.

8. A receiver for a remote-control communication system in which an information signal containing a given message is modulated onto both a first signal at a first frequency to provide a first modulated signal and a second signal at a second frequency that is diverse from the first frequency to provide a second modulated signal, and in which both of the modulated signals are transmitted, the receiver comprising control means for processing the given message to control a given operation of an electronic communication apparatus;

means for detecting and demodulating the first modulated signal to provide the information signal containing the given message;

means for detecting and demodulating the second modulated signal to provide the information signal containing the given message; and processing means for processing both the information signal provided by demodulating the first modulated signal and the information signal provided by demodulating the second modulated signal to select the given message for said operation-control processing by the control means from either the information signal provided by demodulating the first modulated signal or the information signal provided by demodulating the second modulated signal, wherein the processing means includes means for determining whether the given message contained in the information signal provided by demodulating the first modulated signal and the given message contained in the information signal provided by demodulating the second modulated signal are commonly derived; and means for selecting among the given messages contained in the demodulated information signals for said message processing by the control means in accordance with the determination of whether the given message contained in the information signal provided by demodulating the first modulated signal and the given message contained in the information signal provided by demodulating the second modulated signal are commonly derived.

9. A receiver according to claim 8, wherein the processing means includes means for detecting and correcting errors in the given messages contained in the demodulated information signals; and means for selecting among the given messages contained in the demodulated information signals for said message processing by the control means in accordance with said error detection and correction.

10. A receiver according to claim 8 for a remote control system in which the given message is forward-error-correction coded, wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal and the error-corrected given message from the second modulated signal are both correct; and wherein the processing means is adapted for selecting for said message processing by the control means either the given message from the first modulated signal or the given message from the second modulated signal in accordance with a predetermined priority between said messages when the processing means determine that both messages are correct and that both messages are commonly derived.

11. A receiver according to claim 8 for a remote control system in which the given message is forward-error-correction coded, wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal and the error-corrected given message from the second modulated signal are both correct; and wherein the processing means is adapted for selecting for said message processing by the control means either the given message from the first modulated signal or the given message from the second modulated signal in accordance with a predetermined priority between said messages when the processing means determine that both messages are correct and that both messages are not commonly derived.

12. A receiver according to claim 8 for a remote control system in which the given message is forward-error-correction coded, wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal and the error-corrected given message from the second modulated signal are both correct; and wherein the processing means is adapted for discarding both the message from the first modulated signal and the given message from the second modulated signal when the processing means determine that both messages are correct and that both messages are not commonly derived, whereby neither message is processed by the control means.

13. A receiver according to claim 8 for a remote control system in which the given message is forward-error-correction coded, wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal is correct and whether the error-corrected given message from the second modulated signal is correct; and wherein the processing means is adapted for selecting for said message processing by the control means either the given message from the first modulated signal or the given message from the second modulated signal in accordance with which is correct when the processing means determine that only one of said messages is correct without regard as to whether or not both messages are commonly derived.

14. A receiver according to claim 8 for a remote control system in which the given message is forward-error-correction coded, wherein the processing means is adapted for detecting errors in the given message contained in the information signal provided by demodulating the first modulated signal and in the given message contained in the information signal provided by demodulating the second modulated signal, and for correcting said errors in accordance with the forward-error-correction coding;

wherein the processing means is adapted for determining whether the error-corrected given message from the first modulated signal is correct and whether the error-corrected given message from the second modulated signal is correct; and wherein the processing means is adapted for discarding the given message from the first modulated signal and the given message from the second modulated signal when the processing means determine that both of said messages are incorrect without regard as to whether or not both messages are commonly derived, whereby neither message is processed by the control means.

* * * * *